United States Patent [19]
Gotoh et al.

[11] Patent Number: 5,155,385
[45] Date of Patent: Oct. 13, 1992

[54] SEMICONDUCTOR INTEGRATED CIRCUIT DEVICE HAVING A BIAS SUPPLY CURRENT

[75] Inventors: Kunihiko Gotoh, Tama; Yuuji Sekido, Kawasaki, both of Japan

[73] Assignees: Fujitsu Limited, Kanagawa; Fujitsu VLSI Limited, Aichi, both of Japan

[21] Appl. No.: 658,592

[22] Filed: Feb. 21, 1991

[30] Foreign Application Priority Data

Feb. 22, 1990 [JP] Japan ................................ 2-043648

[51] Int. Cl.⁵ .................... H03M 1/66; G05F 3/16
[52] U.S. Cl. ...................... 307/296.8; 323/317; 341/135; 341/136; 341/144
[58] Field of Search ............ 307/296.1, 296.6, 296.8; 323/317; 341/135, 136, 144

[56] References Cited

U.S. PATENT DOCUMENTS

| | | | |
|---|---|---|---|
| 4,766,415 | 8/1988 | Dielacher | 341/136 X |
| 4,814,688 | 3/1989 | Colles | 341/144 X |
| 4,827,260 | 5/1989 | Sugawa | 341/144 X |
| 4,864,215 | 9/1989 | Schouwenaars et al. | 323/317 X |

Primary Examiner—James B. Mullins
Attorney, Agent, or Firm—Nikaido, Marmelstein, Murray & Oram

[57] ABSTRACT

A semiconductor integrated circuit device includes a bias generating circuit having an operational amplifier connected to receive an input voltage at its inverting input terminal to produce a gate voltage. A field transistor has its gate connected to receive the gate voltage from the operational amplifier and its drain connected to a resistor and to a noninverting input terminal of the operational amplifier. A field effect transistor has its gate connected to receive the gate voltage from the operational amplifier to produce a current corresponding to the input voltage. One group of current source is responsive to an output voltage of the bias generating circuit to produce a plurality of currents of an equal magnitude and one switching circuit is responsive to an input digital value to selectively output the currents from the group of current sources to its common output.

13 Claims, 12 Drawing Sheets

SEMICONDUCTOR INTEGRATED CIRCUIT DEVICE HAVING A BIAS SUPPLY CURRENT

BACKGROUND OF THE INVENTION

The present invention relates to a semiconductor integrated circuit device and, more particularly, to improvements in a bias supply for digital-to-analog converters and operational amplifiers integrated into a semiconductor chip.

In the field of demodulation as applied to various types of electronic equipment, such as television equipment, stereophonic equipment, etc., multichannel digital-to-analog (D/A) conversion has been required recently in order to increase signal processing efficiency. To meet this requirement, a semiconductor integrated circuit device has been manufactured in which a plurality of D/A converters are integrated into a single semiconductor chip.

To minimize differences in conversion output among the D/A converters, they are each supplied with a bias voltage from a bias circuit. A small change in power supply voltage thus causes different currents in the D/A converters because they are distributed over a single semiconductor chip. As a result, variations may occur in D/A converter output currents, causing errors among channels Therefore, a device is desired which can minimize errors among D/A converter output channels even if the power supply voltage changes slightly.

FIGS. 1, 2 and 3 illustrate a prior art semiconductor integrated circuit device

FIG. 1 is a block diagram of a prior-art current-output-type D/A converter. As shown, the D/A converter is constructed from a decoder circuit 1, a latch circuit 2, a current selecting and outputting circuit 3 and a load resistor RL. The current selecting and outputting circuit 3 comprises a bias voltage generating circuit 3A, a current source group 3B and a switching circuit 3C.

A description will be made of the operation of the device of FIG. 1 on the assumption that it is a 4-bit current-output-type D/A converter. Upon receipt of digital data DIN, the decoder circuit 1 decodes its value. By this decoding process, of the 15 outputs of the decoder, outputs corresponding in number to the value of the digital data DIN are caused to go to a 1 level.

The digital data (selecting signals S) output from the decoder 1 is applied to the latch circuit 2 which is comprised of 15 flip-flop circuits. The outputs of the latch circuit 2 are coupled to the switching circuit 3C of the current selecting and outputting circuit 3.

The bias voltage generating circuit 3A applies a bias voltage v corresponding to an external control signal to the current source group 3B. The current source group 3B has 15 current sources, each for providing a current corresponding to the bias voltage v. The current outputs are applied to the switching circuit 3C.

The switching circuit 3C has 15 switches, whose respective control terminals are connected to the 15 outputs of the latch circuit 2. Each of these switches is turned on or off by the corresponding one of the 15 outputs (i.e., the decoder output) of the latch circuit to control the flow of a current output from the corresponding one of the 15 current sources.

The switch outputs are coupled in common to an end of the resistor RL. The other end of the resistor RL is connected to ground. All the currents flowing through the switches flow through the resistor. Since the output currents of the 15 current sources are of equal magnitude, the amount of current flowing through the resistor RL is proportional to the number of switches which are simultaneously turned on. This number corresponds to the value of the digital data DIN so that the output current of the current selecting and outputting circuit 3 is proportional to the digital data DIN. Conversion of the output current of the D/A converter to a voltage value is accomplished by passing it through the resistor RL, as shown in FIG. 1.

FIG. 2 illustrates an arrangement of the current selecting and outputting circuit 3 for one channel.

As shown, the bias voltage generating circuit 3A is comprised of an operational amplifier OPJ, a bias generating transistor TJ1 and a bias resistor RBJ.

The transistor TJ1 and the biasing resistor RBJ are connected in series between the power supply and ground. When the gate voltage of the transistor TJ1 increases, the potential at the junction between the bias resistor connected to the noninverting input of the operational amplifier OPJ and the drain of the transistor TJ1 decreases and vice versa. That is, the transistor TJ1 and the resistor form an inverting amplifier. The drain of the transistor TJ1 is connected to the noninverting input of the operational amplifier OPJ and the output of the operational amplifier OPJ is connected to the gate of the transistor TJ1. Thus, the operational amplifier OPJ and the transistor TJ1 form a buffer circuit.

Current flowing through the transistor TJ1 all flows through the resistor RBJ and the output (bias voltage v) of the buffer circuit is applied to the resistor RBJ. Thus, the current flowing through the transistor TJ1 will equal the voltage applied to the inverting input of the operational amplifier OPJ divided by the resistance of the resistor RBJ. The output (bias voltage V) of the operational amplifier serves as a gate voltage which permits the current to flow through the transistor TJ1.

The current source group 3B is constructed from operation setting transistors TJ2 to TJ5, a current mirror circuit comprised of transistors TJ3 and TJ4 and 15 current source transistors TJ61 to TJ615. When the bias voltage v produced by operational amplifier OPJ, bias generating transistor TJ1 and bias resistor RBJ of the bias voltage generating circuit 3A is applied to the operation setting transistor TJ2 of current source group 3B, a bias current ib flows through the transistor TJ2 so that the gate voltage of the transistor TJ5 becomes va. The voltage va is applied to the current source transistors TJ61 to TJ615 as their bias voltages.

The current source transistors TJ61 to TJ615 are selected by the select transistors TK61 to TK615 of the switching circuit 3C so that an output current im is produced. An analog voltage vo is thereby taken at an end of the load resistor RL on the basis of select signals from the latch circuit 2.

With the prior art multichannel D/A converter arrangement described above, the bias voltage v produced by the bias voltage generating circuit 3A is applied in common to the operation setting transistors TJ2 of the current mirror circuits, as illustrated in FIG. 3. Thus, when voltages at power supply points p0, p1, p2, ... pn of the bias voltage generating circuit 3A and the D/A converters shift subtly under the influence of wiring resistance Rl between the D/A converters, bias currents ib1, ib2, ibn of the current source group 3B may correspondingly shift so that they become different from one another. The differences among the bias currents of the current source group will cause variations in the output currents i1, i2, ..., in of the D/A converters, thus producing interchannel errors. This will decrease the reliability of a multichannel type of D/A converter in which a plurality of D/A converters are operated by a common bias circuit.

SUMMARY OF THE INVENTION

It is an object of the present invention to provide a semiconductor integrated circuit device which is adapted to supply a bias current to D/A converters and minimize interchannel errors among outputs of the D/A converters, even when power supply voltages shift subtly due to wiring resistances.

The present invention provides a semiconductor integrated circuit device comprising:

a bias generating circuit having an operational amplifier connected to receive an input voltage at its inverting input terminal to produce a gate voltage, a first field effect transistor whose gate is connected to receive the gate voltage from the operational amplifier and whose drain is connected to a resistor and to an noninverting input terminal of the operational amplifier, and at least one second field effect transistor whose gate is connected to receive the gate voltage from the operational amplifier to produce a current corresponding to the input voltage;

at least one group of current sources responsive to an output voltage of the bias generating circuit to produce a plurality of currents of an equal magnitude; and at least one switching circuit responsive to an input digital value to selectively output the currents from the group of current sources to its common output.

DETAILED DESCRIPTION OF THE PREFERRED EMBODIMENTS

Figure 1:
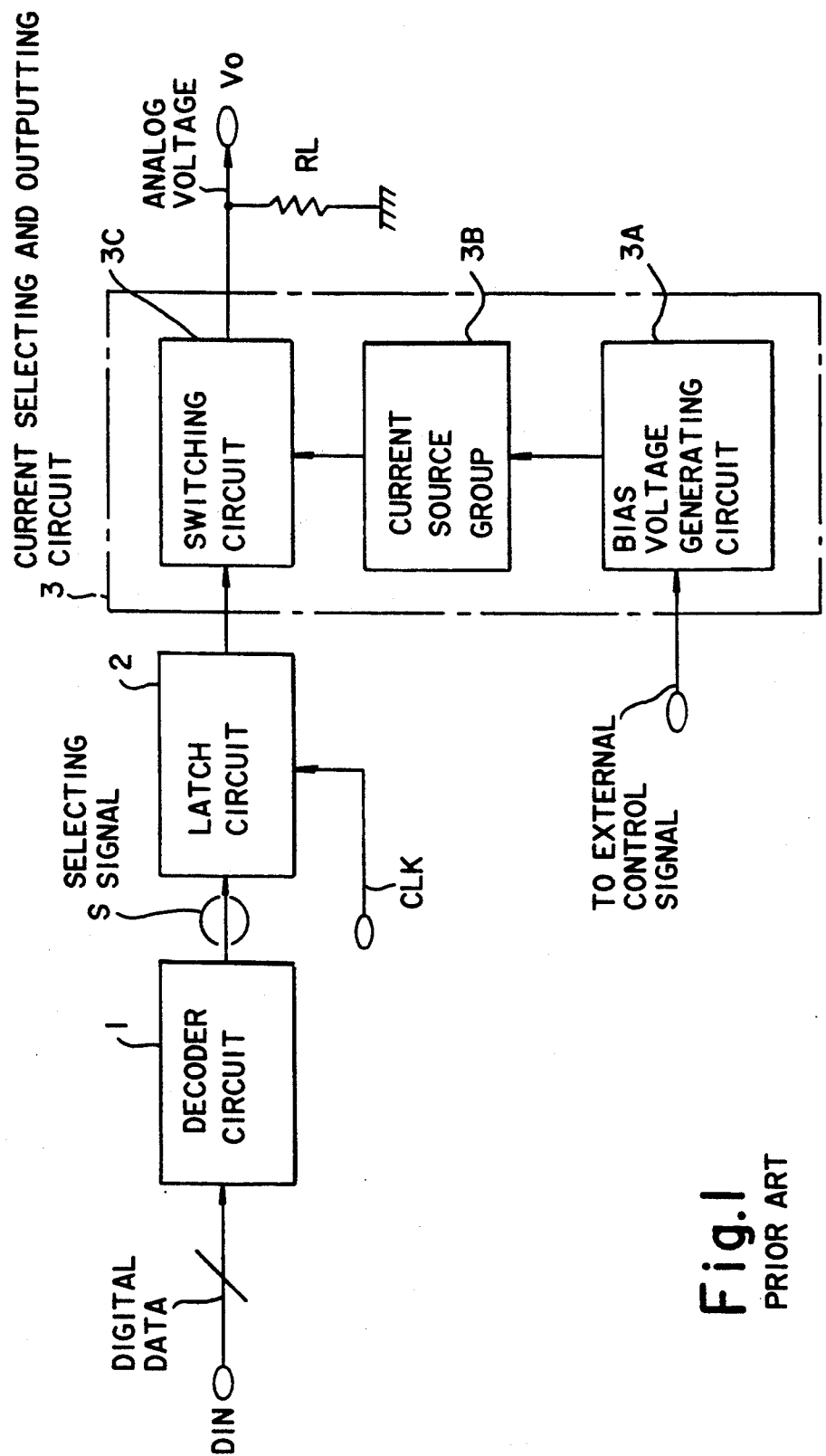
FIG. 1 is a block diagram of one channel of a prior art n-channel current-output-type D/A converter.
Figure 2:
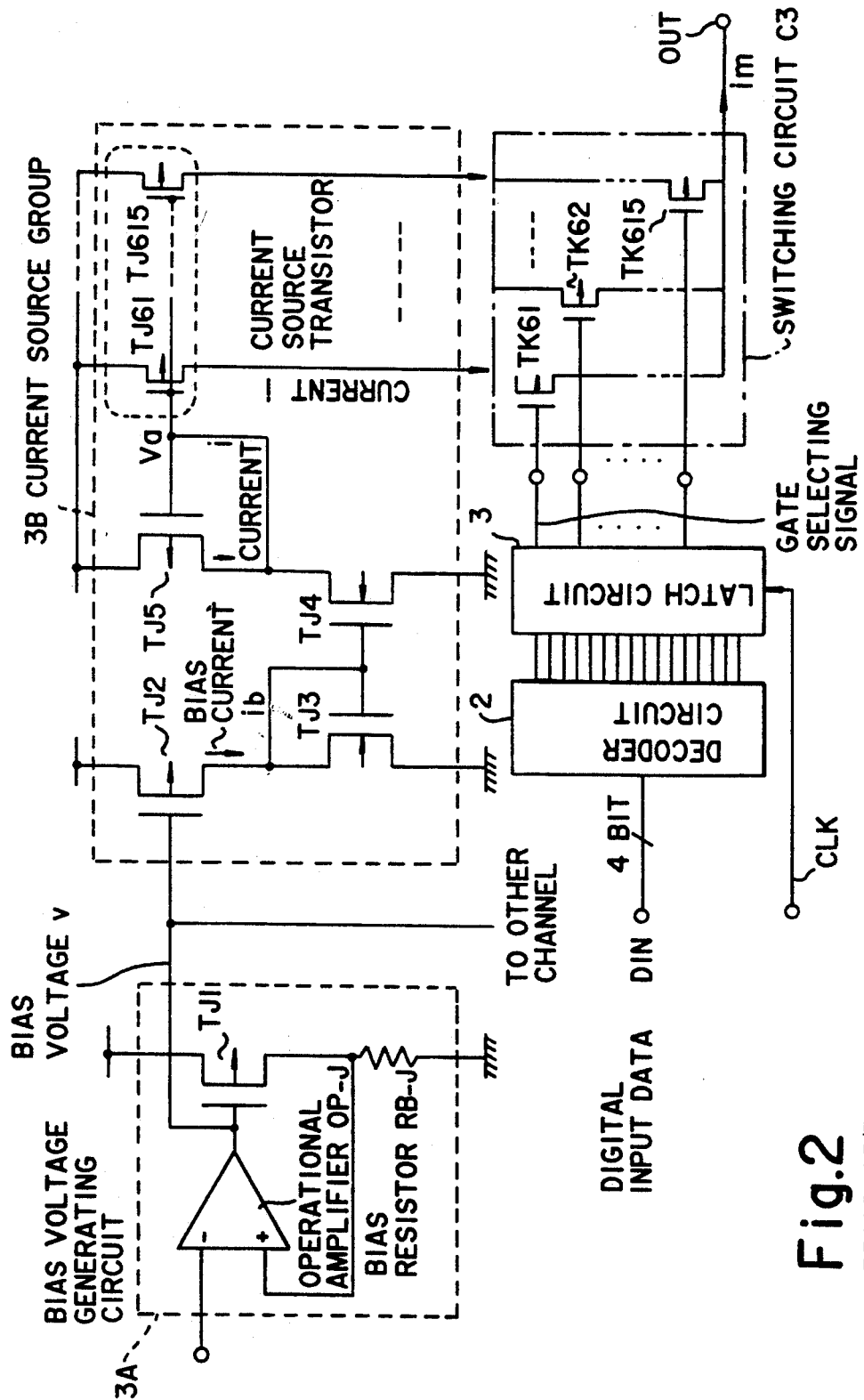
FIG. 2 illustrates an arrangement of the current selecting and outputting circuit of FIG. 8.
Figure 3:
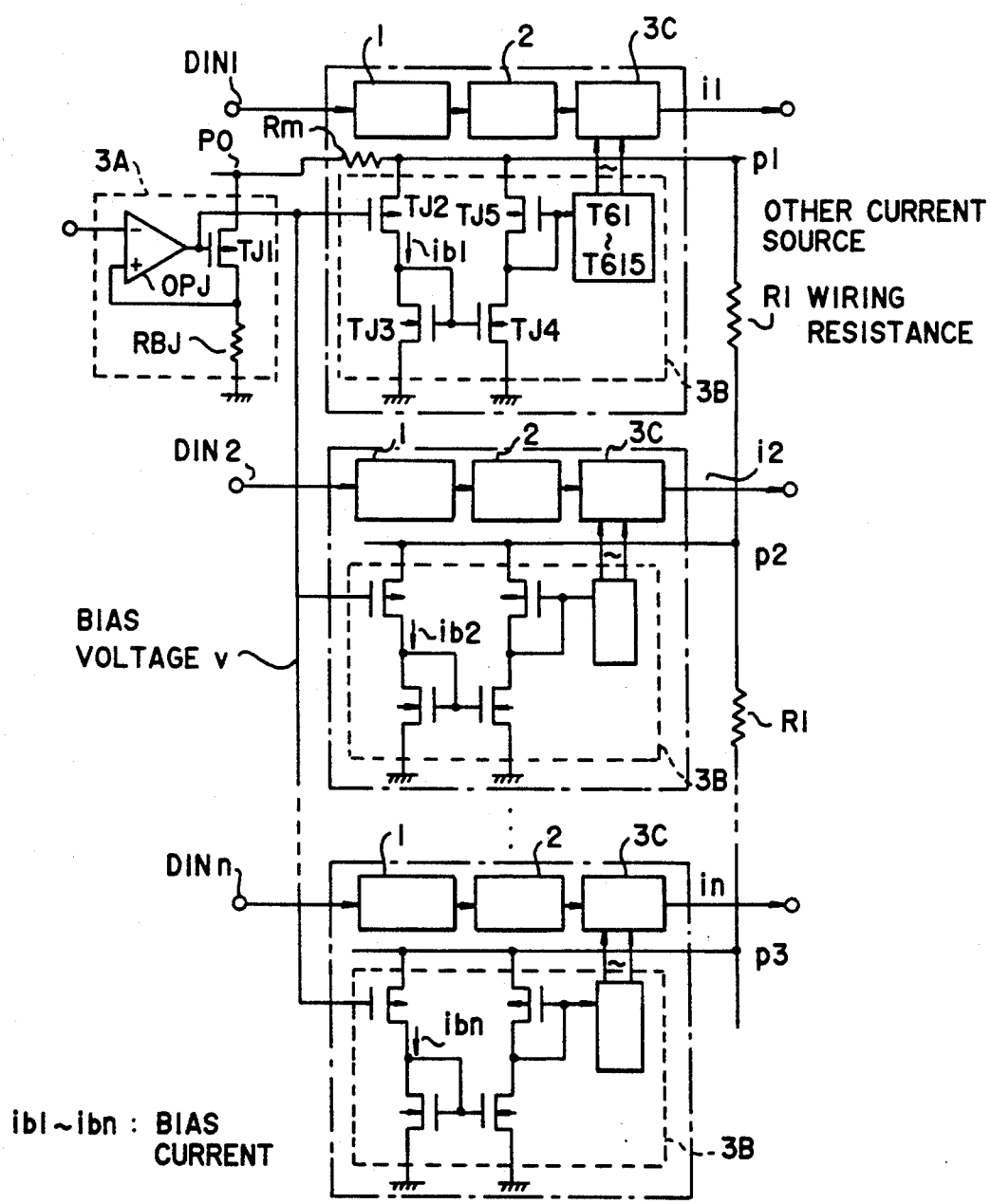
FIG. 3 is a diagram for explaining problems with the prior-art n-channel current-output- type D/A converter.
Figure 4:
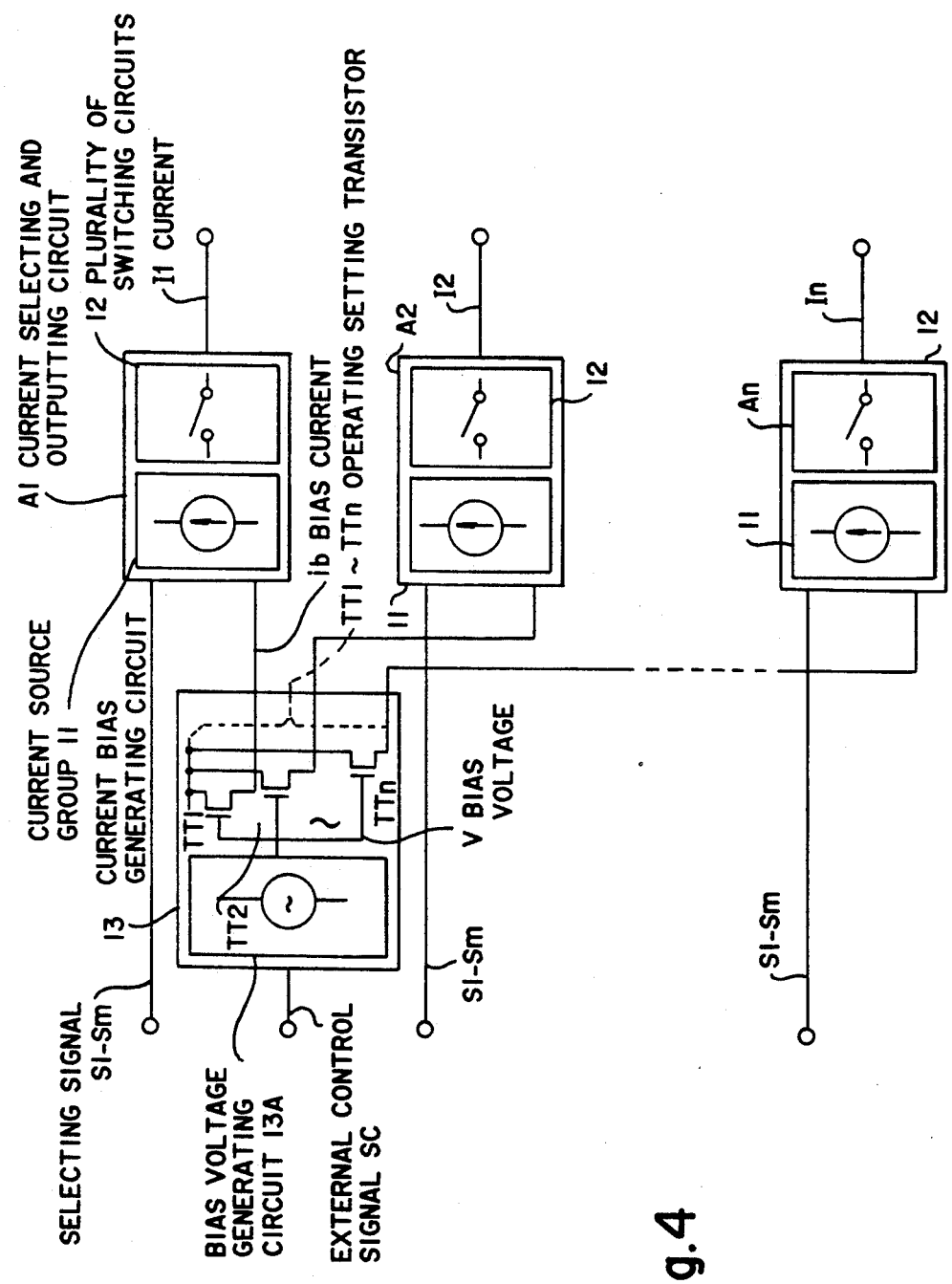
FIG. 4 is a diagram illustrating the principle of a first semiconductor integrated circuit of the present invention.
Figure 5:
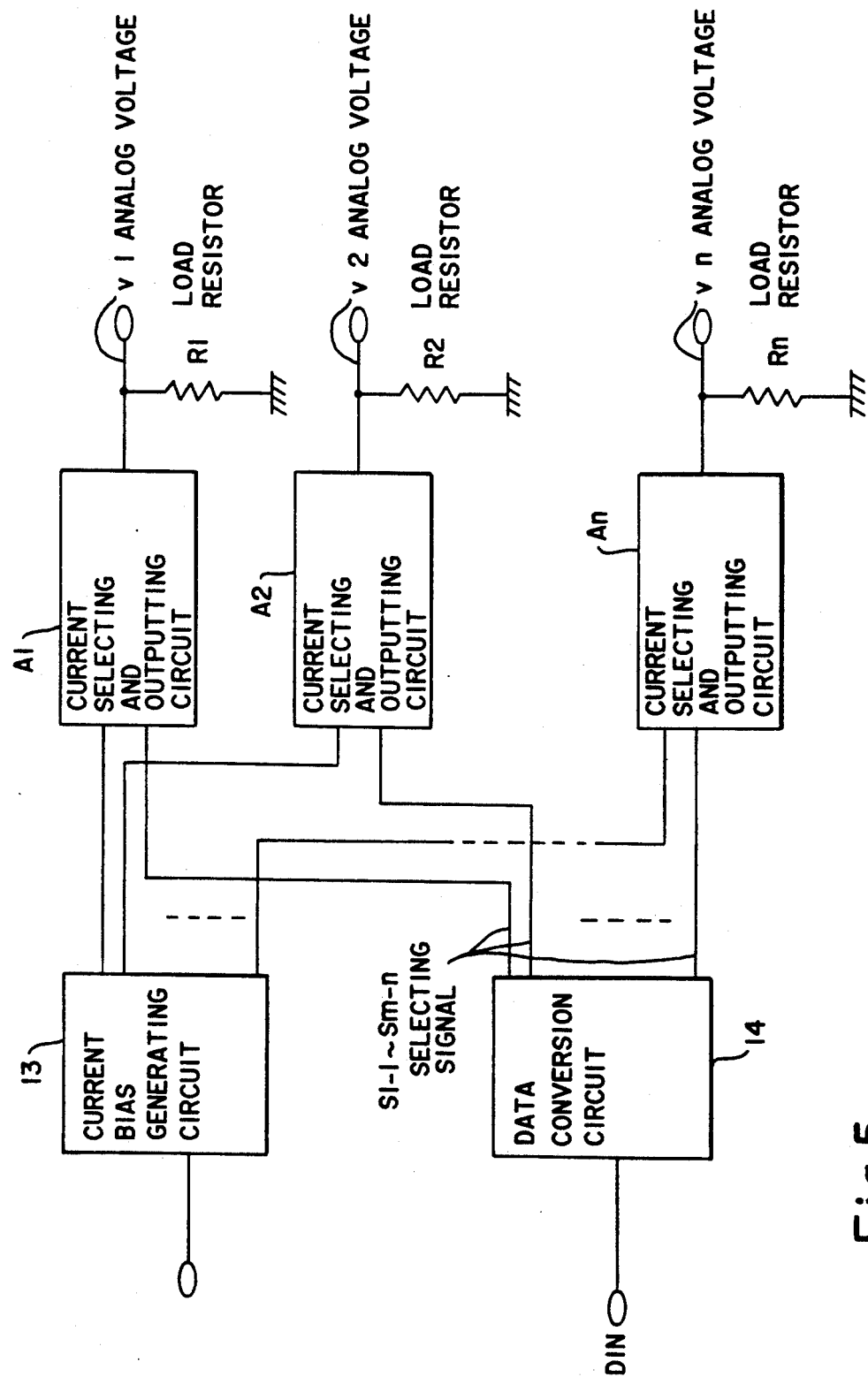
FIG. 5 is a diagram illustrating the principle of a second semiconductor integrated circuit of the present invention.

FIG. 4 illustrates the principle of a first semiconductor integrated circuit device according to the present invention, and FIG. 5 illustrates the principle of a second semiconductor integrated circuit device according to the present invention.

The first semiconductor integrated circuit device comprises n current source groups 11 each providing m currents of magnitude i, n current selecting and outputting circuits A1 to An each having m switches 12 responsive to select signals S1 to Sm for selectively outputting the m currents and a current bias generating circuit 13 for providing a bias current ib to each of the current selecting and outputting circuits A1 to An. Two or more current selecting and outputting circuits A1 to An are formed on a single semiconductor chip. The current bias generating circuit 13 comprises a bias voltage generating circuit 13A responsive to an external control signal SC for generating a bias voltage v and transistors TT1, TT2, ..., TTn, each responsive to the bias voltage v to generate the bias current ib.

According to the first semiconductor integrated circuit device, the current bias generating circuit 13, which is comprised of the bias voltage generating circuit 13A and the operation setting transistors TT1 to TTn, is provided for supplying the bias current ib to the current selecting and outputting circuits A1 to An.

Even if the current selecting and outputting circuits A1 to An are distributed over a single semiconductor chip and voltages at power supply points of the current selecting and outputting circuits A1 to An deviate subtly, they can be supplied with an equal bias current ib. This is because the operation setting transistors T1 to Tn are centrally disposed in the current bias generating circuit 13 and are thus unaffected by the supply voltage. Thus, each of the current output circuits can perform its current selecting and outputting operation without any error.

In addition to the arrangement of the first semiconductor integrated circuit device the second semiconductor integrated circuit device is further provided with a data converter 14 responsive to digital data DIN for outputting the select signals S1-1 to Sm-n and load resistors R1 to Rn connected to the output point of the current selecting and outputting circuits A1 to An, thereby providing analog voltages v1 to vn corresponding to the digital data DIN.

According to the second semiconductor integrated circuit device, data converter 14 and load elements R1-Rn are provided to the first semiconductor integrated circuit device, analog voltages V1-Vn are output based on digital data D/N. A multi-channel D/A converter of a current output type in which an error between channels is minimized can be constructed as an application of the first semiconductor integrated circuit device. Therefore, a reliability of the multi-channel D/A converter can be increased as compared with the prior art.

Figure 6:
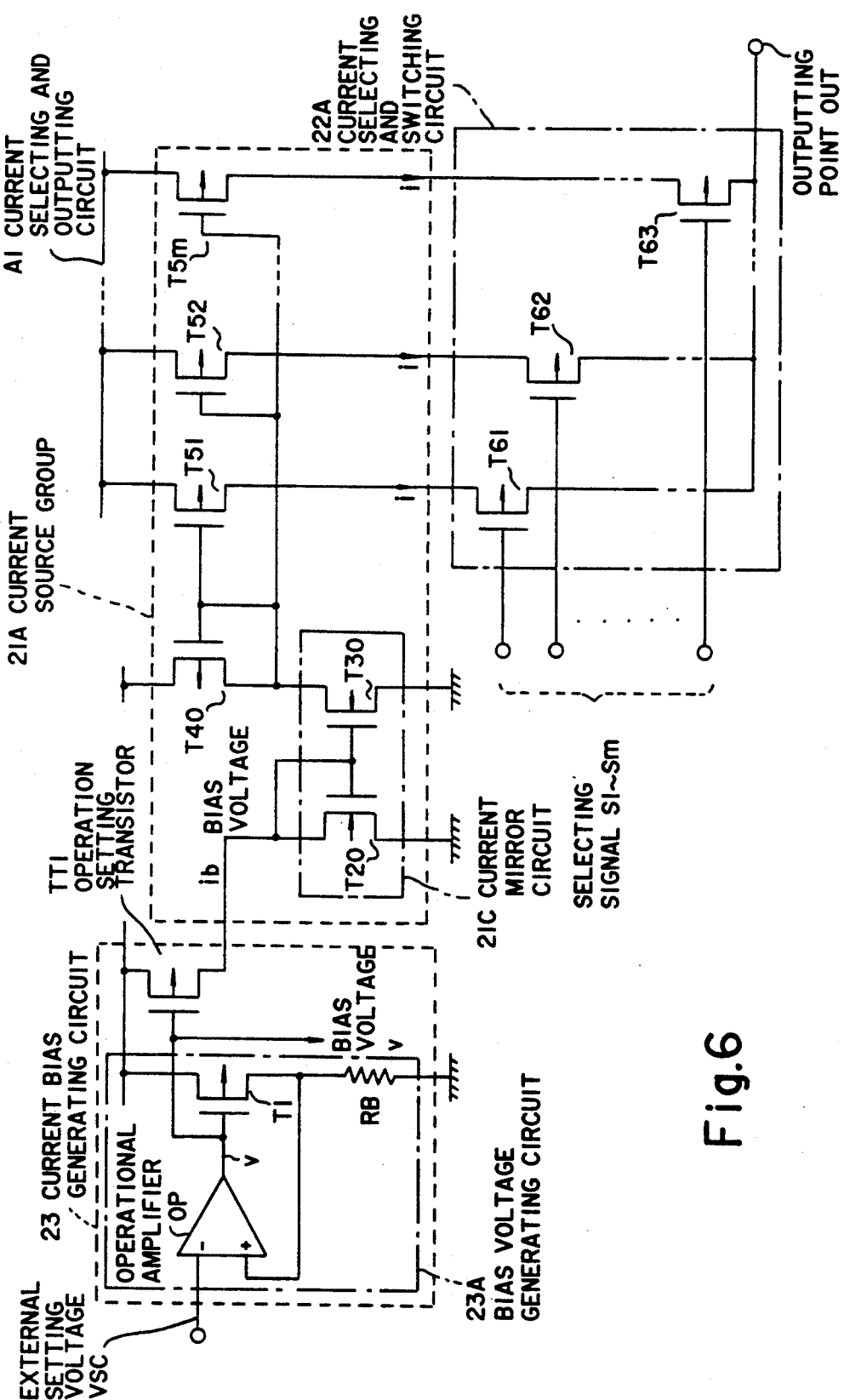
FIG. 6 illustrates a one-channel arrangement of an n-channel current selecting and outputting circuit device according to a first embodiment of the present invention.
Figure 7:
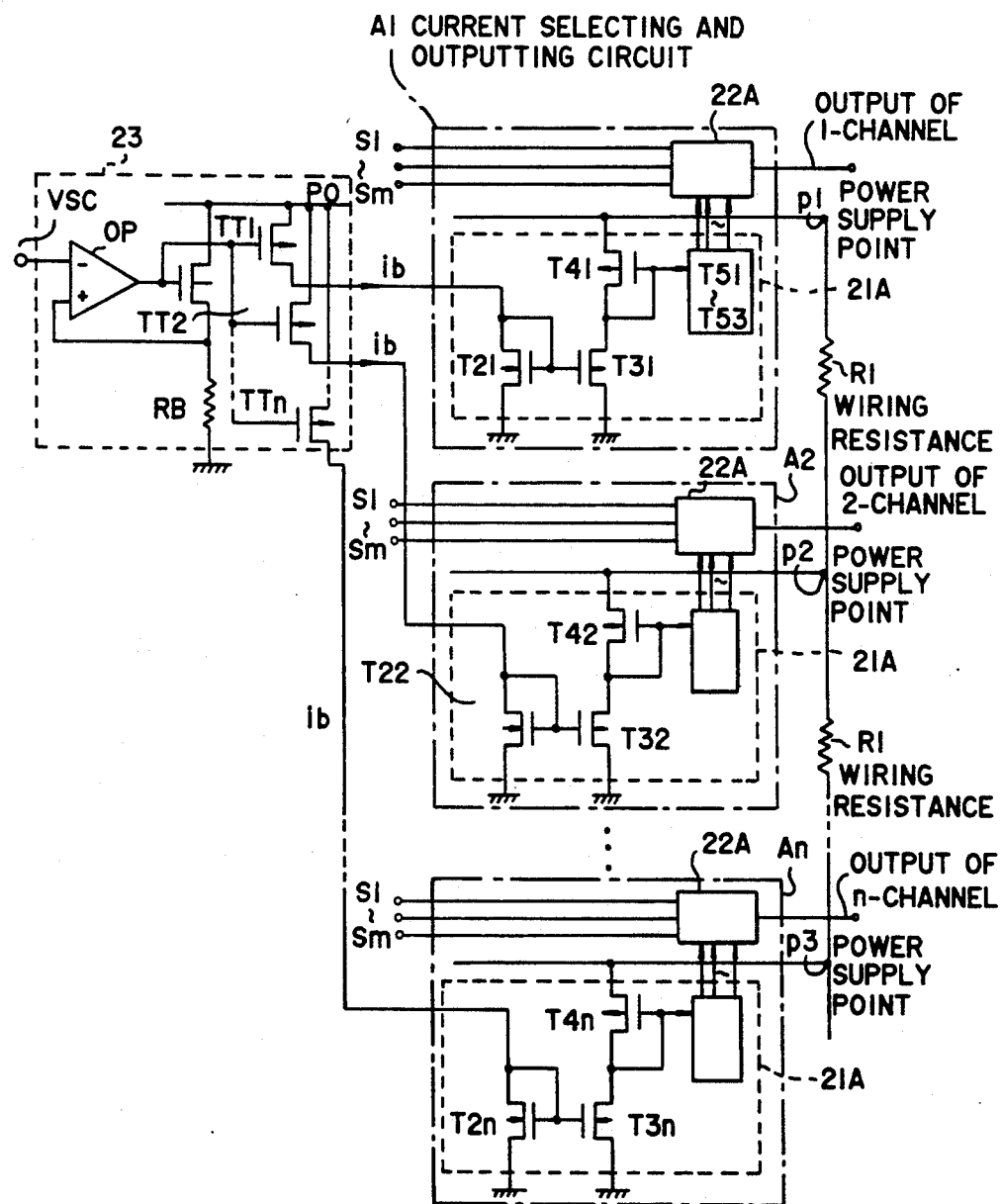
FIG. 7 is a circuit diagram of an integrated circuit of the n-channel current selecting and outputting circuit according to the first embodiment of the present invention.

FIGS. 6 and 7 illustrate an arrangement of a multi-channel current output circuit according to a first embodiment of the present invention. FIG. 6 illustrates its one-channel arrangement.

The current output circuit A1 comprises a current source group 21A and a current select switching circuit 22A. The current source group 21A comprises a current mirror circuit 21C formed of n-channel MOS transistors T20 and T30 whose sources are connected to ground, and current source transistor forming p-channel MOS transistors T40, T51, ..., T5m whose sources are connected to a power supply. The function of the current source group 21A is to generate, for example, 15 currents i in the case where a signal designating voltages comprises four bits (m=15) in response to the bias current ib.

The switching circuit 22A is responsive to the select signals S1 to Sm to selectively output the currents i and comprises n-channel MOS transistors T61, T62, ..., T6m.

A current bias generating circuit 23 is an embodiment of the current bias generating means 13. It is responsive to an external setting voltage VSC to output the bias current ib and comprises a bias voltage generating circuit 23A and an operation setting transistor TT1. The external setting voltage VSC is an embodiment of the external control signal SC.

The bias voltage generating circuit 23A comprises an operational amplifier OP, a bias generating transistor T1 and a bias resistor RB. The drain of the transistor T1 and the resistor RB constitute an inverting amplifier. The junction between he drain of the transistor T1 and the resistor RB serves as the output, which is coupled to the noninverting input of the operational amplifier OP. The output of the operational amplifier OP is connected to the gate of the transistor T1. Thus, the operational amplifier, the transistor T1 and the resistor RB constitute a feedback amplifier. When the external setting voltage VSC is applied to the operational amplifier OP, a terminal voltage of the bias resistor RB is determined by virtual ground. This terminal voltage determines a current flowing through the bias generating transistor T1 and hence a gate voltage of T1. This gate voltage is the bias voltage v, which is applied to the operation setting transistor TT1.

The operation setting transistor TT1 is provided in the current source group 21A in the prior art current output type D/A converter. In the present invention, on the other hand, it is provided in the current bias generating circuit 23.

Even if wiring between the transistor TT1 and the transistor T20 of the current source group 21A is made long, an equal current ib flows through the transistors TT1 and T20 (when the transistors T and TT1 are of the same size). Thus, the transistor T20 is biased properly without being affected by the supply voltage.

Figure 8:
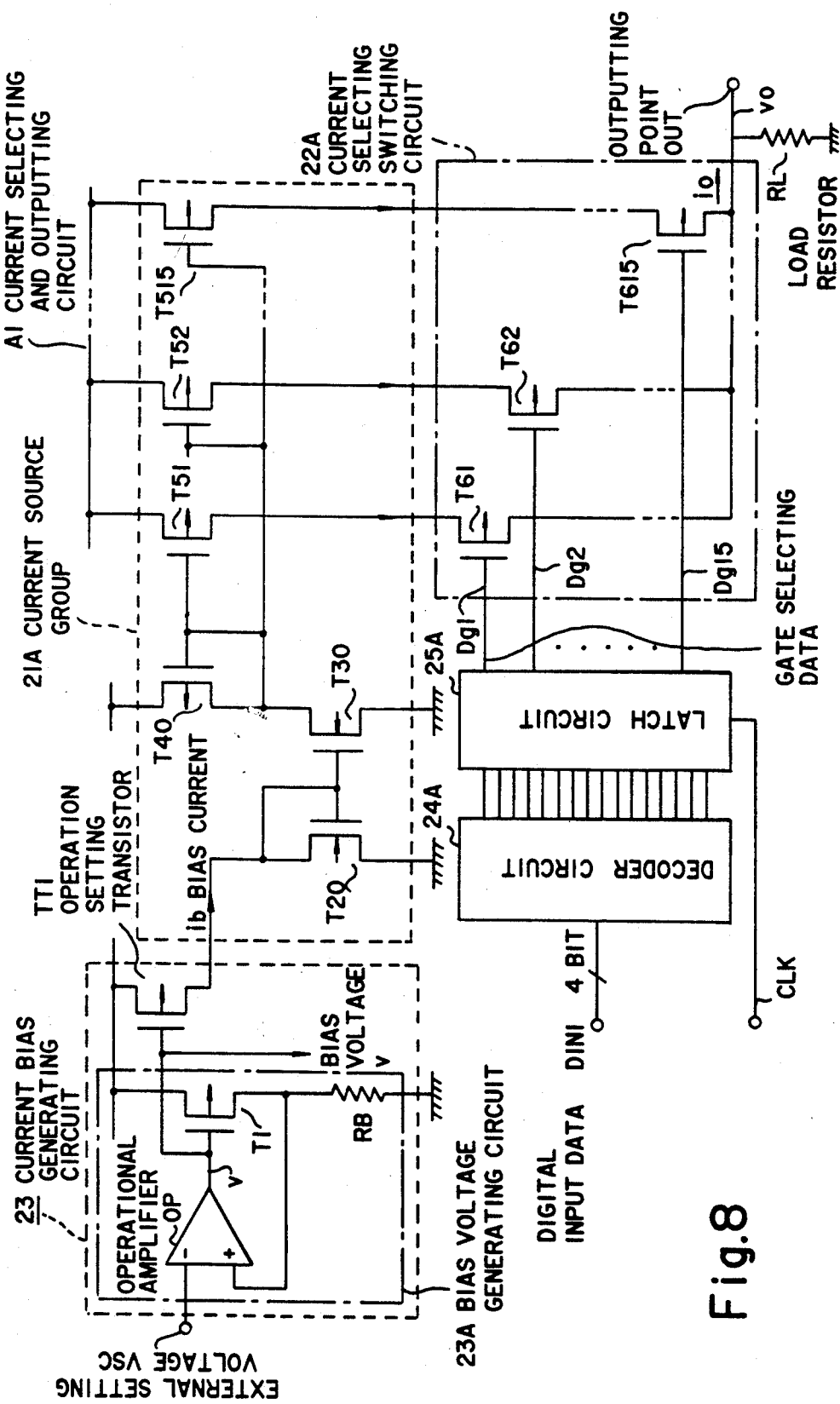
FIG. 8 illustrates a one-channel arrangement of a current-output-type D/A converter according to a second embodiment of the present invention.
Figure 9:
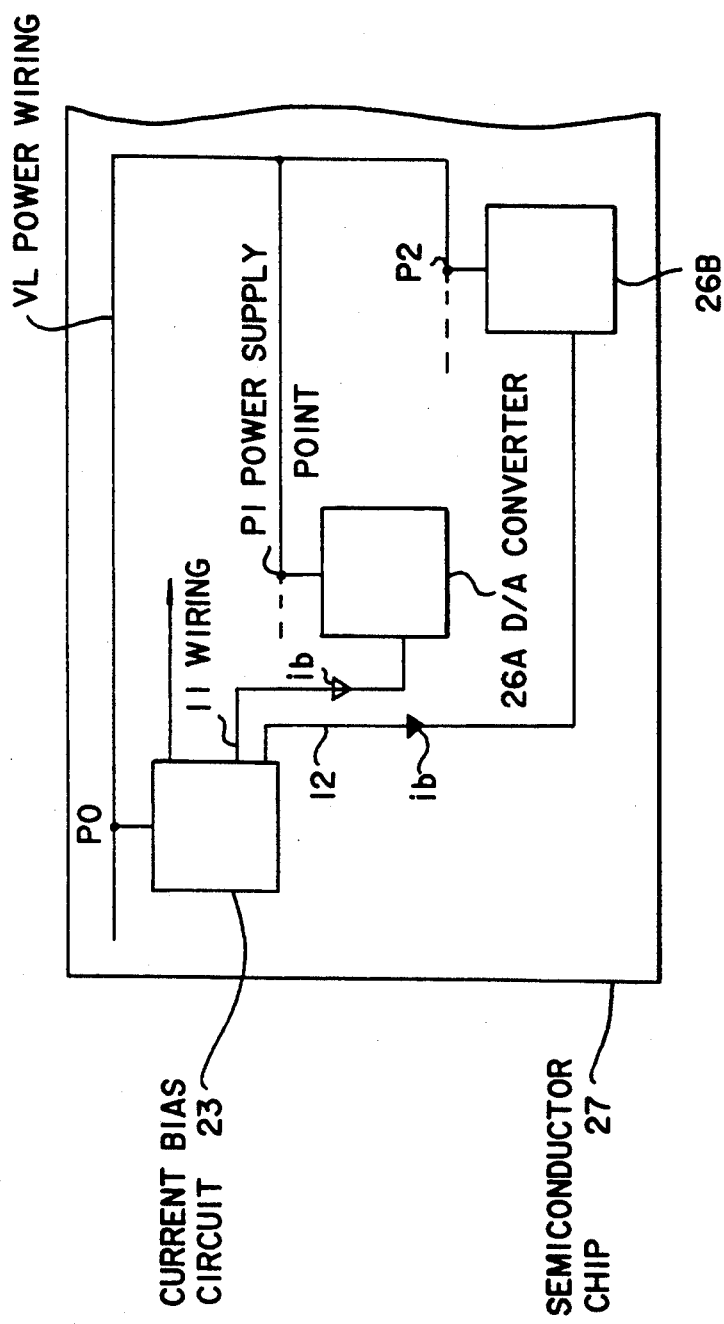
FIG. 9 illustrates an arrangement of an n-channel D/A converter according to the second embodiment of the present invention.
Figure 10:
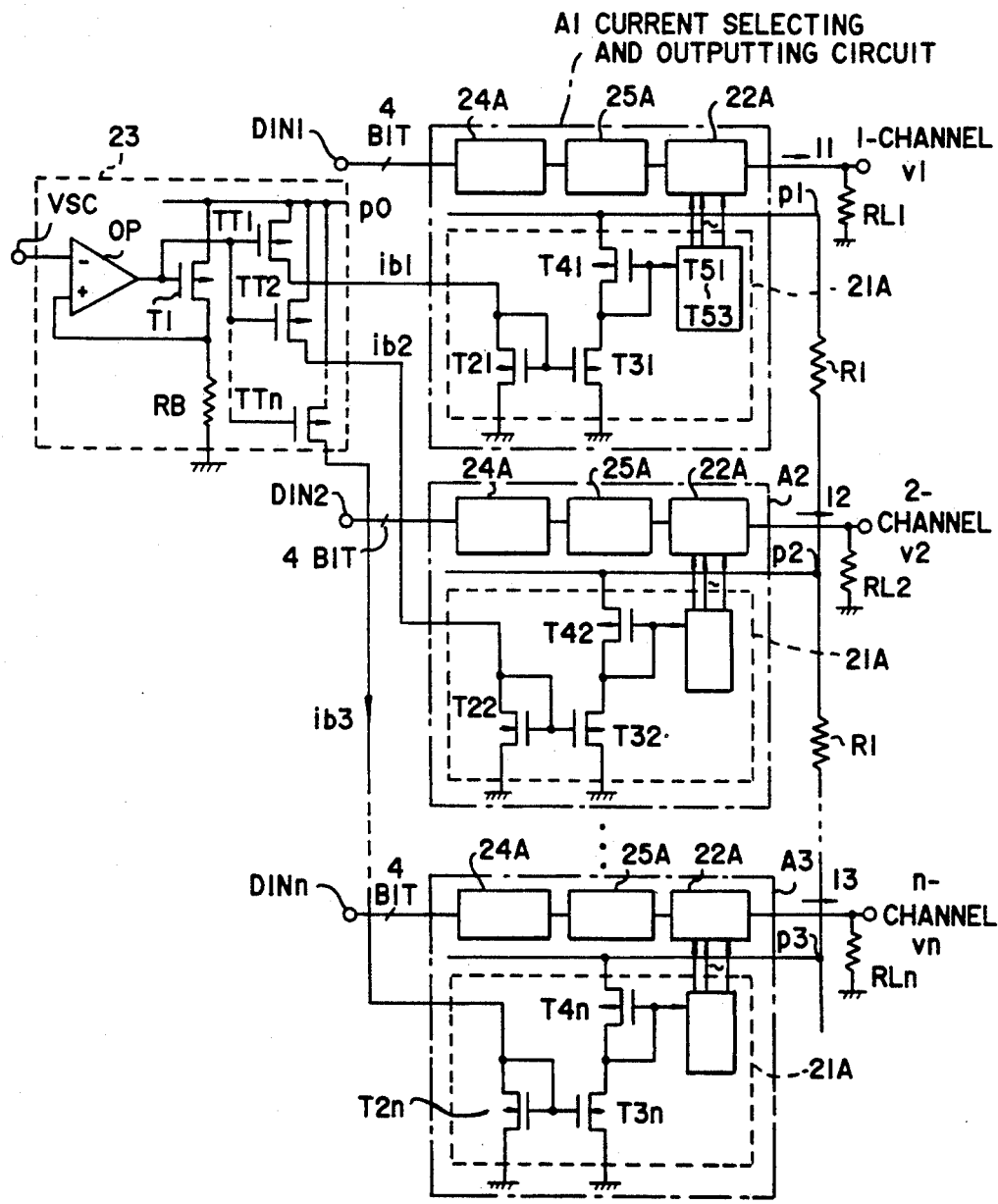
FIG. 10 is a circuit diagram of an integrated circuit of the n-channel D/A converter according to the second embodiment of the present invention.

Thus, a plurality of current-output-type D/A converters can be formed in a single semiconductor chip as illustrated in FIGS. 8 to 10 to constitute current selecting and outputting circuits of multichannel D/A converters adapted to demodulate multi-signals in television equipment or stereophonic equipment.

FIG. 7 is an integrated circuit diagram of n-channel D/A converter, i.e., an n-channel current selecting and outputting circuit device according to the first embodiment of the present invention.

The n-channel D/A converter, i.e., n-channel current circuit device is provided with a single current bias generating circuit 23 in a single semiconductor chip, which is common to plural current selecting and outputting circuits A1 to An for outputting currents onto n channels.

Here use is made of the circuit 23 of FIG. 6 as the current bias generating circuit 23, and the current selecting and outputting circuits A1 to An are distributed over the semiconductor chip as in the prior art. Thus, voltages at supply points p0, p1, p2, p3 may be subtly different from one another under the influence of wiring resistance Rl between current output circuits. The current selecting and outputting circuits A1 to An are supplied separately with the bias current ib from the current bias generating circuit 23. This point is distinct from the prior art in which the bias voltage v is distributed to the current selecting and outputting circuits A1 to An.

According to the first embodiment, as described above, the current bias generating circuit 23 comprising the bias voltage generating circuit 23A and the operation setting transistors TT1 to TTn is adapted to supply the bias current ib to the current selecting and outputting circuits A1 to An.

Elements constituting the current bias generating circuit 23 are formed on a part of a semiconductor chip. The resistance of wiring to the gate of each of the transistors TT1 to TTn is negligible. Thus, they operate under the same conditions and the currents flowing therein also become equal to ib.

Thus, even if plurality of the current selecting and outputting circuits A1 to An are distributed over a single semiconductor chip and supply voltages at the power supply points p0, p1, p2, ..., pn of the bias voltage generating circuit 23A and the current selecting and outputting circuits A1 to An deviate subtly, the operation setting transistors TT1 to TTn are unaffected by the supply voltages because they are centrally disposed in the current bias generating circuit 23. Unlike the prior art, in which the operation setting transistors TT1 to TTn are respectively disposed in the current selecting and outputting circuits A1 to An, this permits an equal bias current ib to be supplied to the current selecting and outputting circuits A1 to An independently of the supply voltages at the power supply points p0, p1, p2, ..., pn. Thereby, it becomes possible for the current selecting and outputting circuits A1 to An to perform their current selecting and outputting operation without any error.

Next, a description is made of an application of the first n-channel current output circuit device to the n-channel D/A converter is described.

FIGS. 8 and 9 illustrate an arrangement of the n-channel D/A converter according to the second embodiment of the present invention. FIG. 8 illustrates its one-channel arrangement.

The second embodiment is distinct from the first embodiment in that a data conversion means 14 for converting digital data DIN to select signals S1 to Sn and a load resistor RL connected to the current output point of the current selecting and outputting circuit A1 are added to the n-channel current output circuit device of FIG. 4, thereby converting the digital data DIN to an analog voltage vo.

The data conversion means 14 comprises a decoder 24A and a latch circuit 25A. The decoder 24A is responsive to, for example, 4-bit digital input data DIN to cause one of its 15 output lines to go to a 1 level.

The latch circuit 25A responds to a clock signal CLK to hold an output state of the 15 output lines of the decoder 24A and provides gate select data Dg1, Dg2, ..., Dg15, serving as the select signals S1 to Sn, to the switching circuit 22A.

The load resistor RL is connected to the output of the switching circuit 22A so as to provide a voltage corresponding to a current or currents selectively drawn out of the current source group 21A by the switching circuit.

In the second embodiment, parts designated by the same reference characters as those in the first embodiment have like functions and thus their descriptions are omitted.

FIG. 9 illustrates an arrangement of the n-channel D/A converter according to the second embodiment of the present invention.

This n-channel D/A converter is constituted by disposing one current bias generating circuit 23 and n current output type D/A converters 26A, described above, on a single semiconductor chip 27.

To the current bias generating circuit 23 are connected the current output type D/A converters 26A by lines 11, 12, . . . , respectively, each carrying the bias current ib.

FIG. 10 is an integrated circuit diagram of the n-channel D/A converter according to the second embodiment of the present invention.

The n-channel D/A converter comprises one current bias generating circuit 23 and n current selecting and outputting circuits A1 to An, which are all formed on a single semiconductor chip. Their detailed arrangements are shown in FIGS. 6 to 9 and thus their descriptions are omitted.

The operation of the converter is described below.

First, an external setting voltage VSC is input to set the bias current ib. The bias voltage v is thereby applied from the bias voltage generating circuit 23A to the operation setting transistors TT1 to TTn through the operational amplifier OP, the bias generating transistor T1 and the bias resistor RB. As a result, the operation setting transistors TT1 to TTn are turned ON so that the bias current ib flows through each of the transistors T11 to T1n. The bias current ib depends on the bias voltage v applied to the gate of each transistor. It is applied to each of the n current source groups 21A of the n current selecting and outputting circuits A1 to An.

A current which is determined by the bias current ib flows through each of the current source groups 21A and a desired magnitude of current can be drawn by the switching circuit 22A.

On the other hand, the transistors T61, T62, . . . , T615 of the switching circuits 22A are selected by 4-bit input data DIN1, DIN2 and DINn to the decoders 24A so that currents i1, i2, . . . , in, respectively, flow out of the current source groups 21A.

A voltage drop is thereby produced across each of the load resistors RL1, RL2 and RLn so that analog voltages V1 to Vn are outputs onto channels 1 to n, respectively. The voltage vn is expressed by

*Vn = (resistance of RLn) × in*

According to the second embodiment of the present invention, as described above, the decoders 14A, the latch circuits 25A and the load resistors RL1 to RLn are added to the first n-channel current output circuit device to thereby output analog voltages v1 to vn, which correspond to digital data DIN1 to DINn, respectively.

For this reason, even if voltages at the power supply points p1, p2, p3 of D/A converter, etc., deviate subtly under the influence of wiring resistance Rl between D/A converters, the bias currents ib1, ib2, . . . , ibn to the current source groups 21A can be set such that ib1 = ib2 = 4 . . . ibn, unlike in the prior art in which ib1 ≠ ib2 . . . ≠ ibn. Thus, differences among the output currents of the D/A converters for the same digital data can be minimized. This improves the reliability of the multichannel D/A converter.

According to the present invention, as described above, the operation setting transistors for the current source groups of the plural current selecting and outputting circuits are centrally disposed in the current bias generating circuit to supply them with bias currents. Therefore, even if the supply voltages at the power supply points of the current selecting and outputting circuits shift subtly, they can be supplied with an equal bias current because the operation setting transistors are not under the influence of the power supply voltage. It thus becomes possible for the current selecting and outputting circuits to perform their current selecting and outputting operation without any error.

Moreover, according to the present invention, a current output type multi-channel D/A converter can be provided which permits the conversion difference among channels to be minimized. Thus, the reliability of the multichannel D/A converter can be improved as compared with the prior art.

Figure 11:
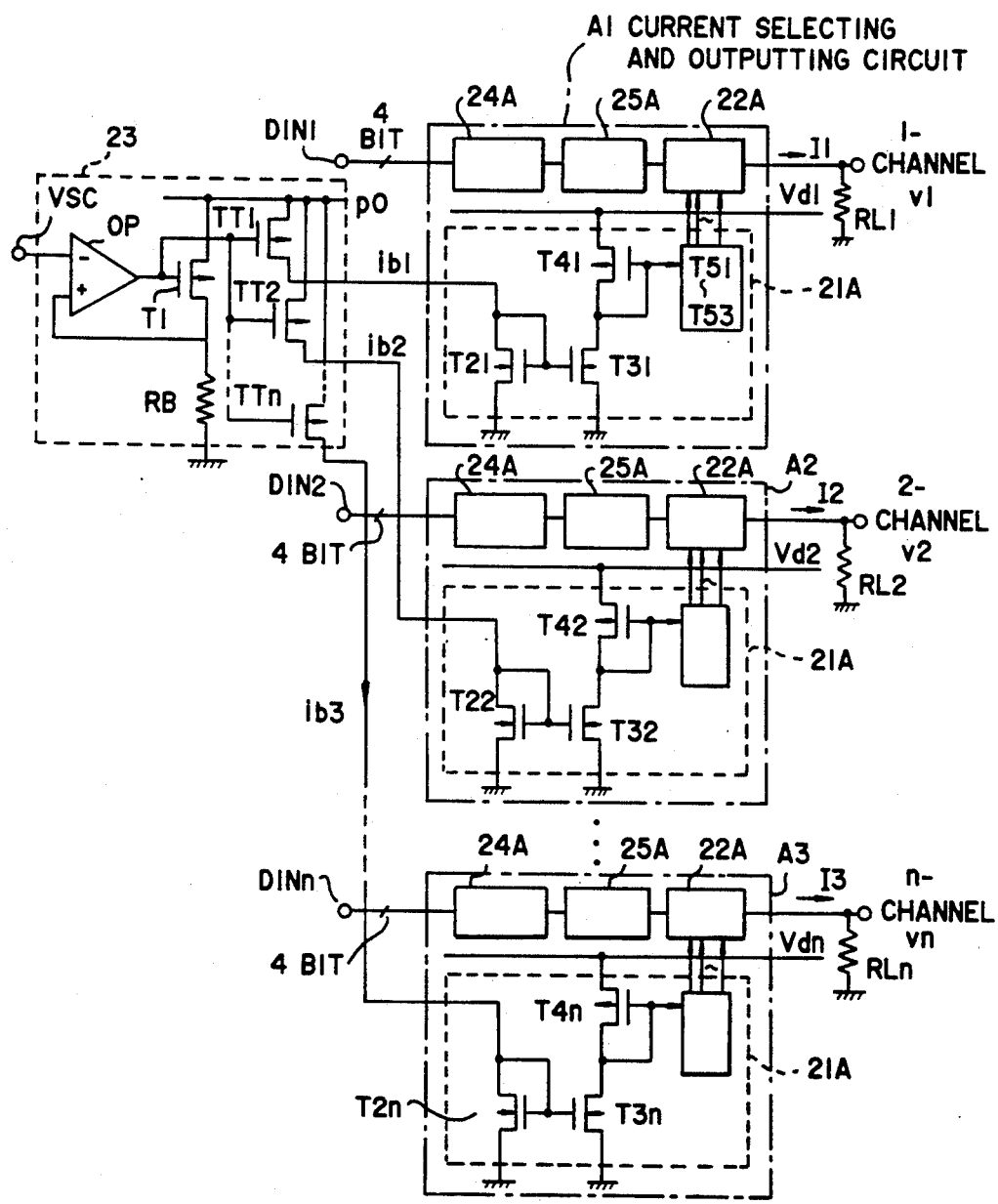
FIG. 11 shows the structure of a further embodiment of the present invention.

FIG. 11 shows the structure of a further embodiment of the present invention. The power source is provided corresponding to the digital data DIN1 to DINn. It produces voltages Vd1 to Vdn. Even where the voltage Vd1 to Vdn are variable within the scope of the error, the current mirror circuit depends only on the voltage applied to the terminal P0 and the currents flowing through respective channels are equal. Thus, thereby providing a D/A converter with a small range of variation in its respective channels is provided.

Figure 12:
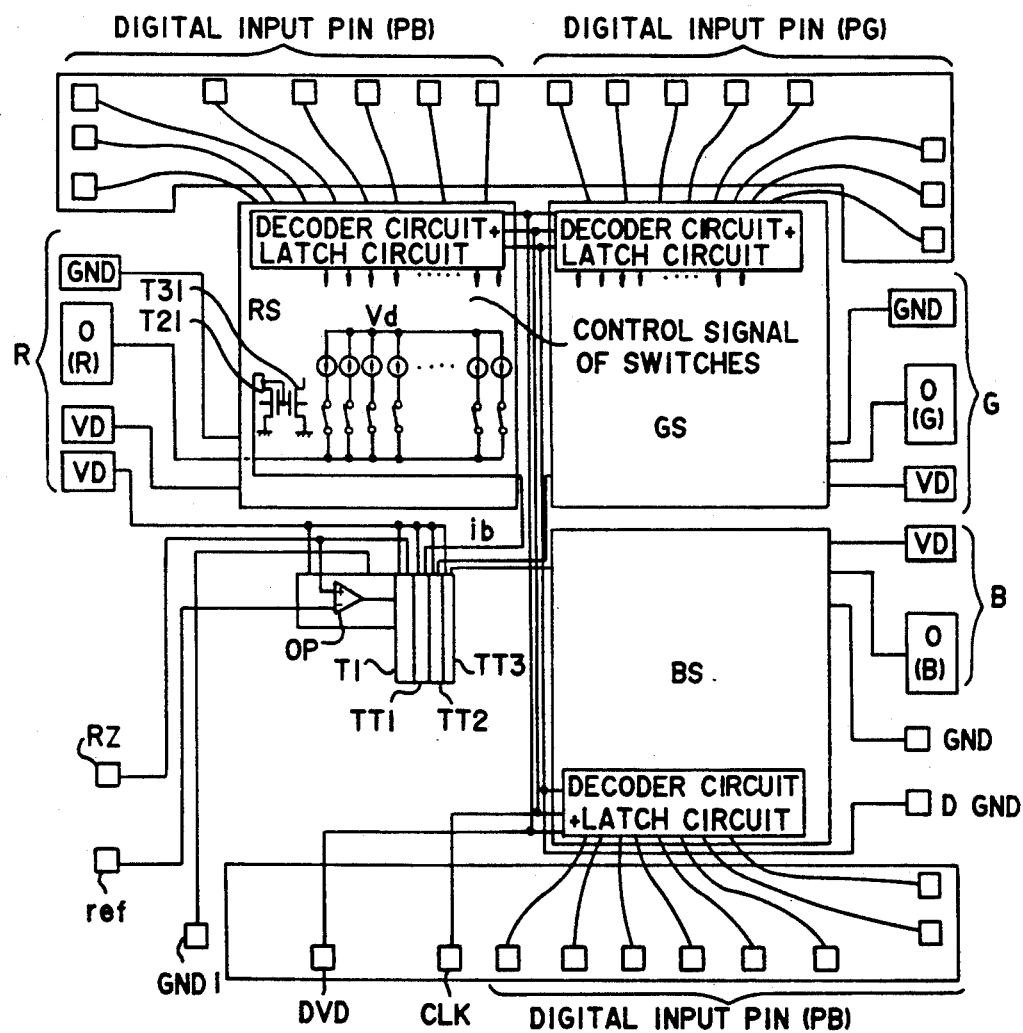
FIG. 12 shows an arrangement in which the circuit shown in FIG. 11 is provided in 1 chip to correspond to three channel

FIG. 12 shows an arrangement in which the circuit shown in FIG. 11 is provided on 1 chip to correspond to three channel. These three channels are for R, G and B of color image. Also provided are a D/A converter RS for R, a D/A converter GS for G and a D/A converter BS for B. Digital circuits (DECODER CIRCUIT & LATCH CIRCUITS ) are provided on the input side of respective D/A converters RS, GS and BS. The power source, clock and ground of the digital circuits are respectively connected to the digital VD terminal DVD, clock terminal CLK and digital ground DGND. The output of the digital circuits control respective switches. Bias voltage generating circuit 23 is also provided as shown in FIG. 12. The drain of transistor T1 is connected to the noninverted input of the operational amplifier OP and to terminal RZ. The user provide resistor RB outside the chip and the ground pin GND1 is connected to terminal RZ through resistor RB, thereby forming a bias voltage generating circuit as shown in FIG. 11.

With this structure, a current in proportion to a current flowing through transistor T1 flows through transistors TT1, TT2 and TT3. The currents flowing these transistors are equal as their operational conditions are the same. Therefore, D/A converters BS, GS and RS through which these currents flow perform the same characteristic conversion. Even if a different voltage is applied to power source terminal VD (R, G and B) of respective D/A converters, the current output 0 (for R, G, and B) do not vary between respective channels (for R, G and B).

What is claimed is:

1. A semiconductor integrated circuit device formed on a single semiconductor chip comprising:
   a bias generating circuit having a producing means for producing a gate voltage, said bias generating circuit including a plurality of field effect transistors having gates connected to receive the gate voltage from said producing means, each field effect transistor producing a respective first current; and
   a plurality of D/A converters, each D/A converter including
      at least one group of current sources responsive to said first current produced from one of said plurality of said field effect transistors to produce a plurality of second currents; and
      at least one switching circuit responsive to an input digital value to selectively output the second currents from said group of current sources to a common output.

2. The semiconductor integrated circuit device according to claim 1, in which said common output of said switching circuit is connected to a resistor to convert current to voltage.

3. The semiconductor integrated circuit device according to claim 1, in which said bias generating circuit is formed on said single semiconductor chip.

4. The semiconductor integrated circuit device according to claim 1, in which said switching circuit has as many switches as there are current sources in said current source group, each of said switches forming a pair with a respective one of said current sources and a number of pairs being smaller by one than a maximum value of said input digital value.

5. The semiconductor integrated circuit device according to claim 4, in which, in said switching circuit, switches corresponding in number to the input digital value are turned on simultaneously.

6. The semiconductor integrated circuit device according to claim 1, in which the input digital data are ON signals obtained by decoding input data of plural bits and correspond in number to the input digital data.

7. The semiconductor integrated circuit device according to claim 6, in which, when the input digital data has l bits, a number of said switches and a number of said current sources each equal l th power of 2 minus 1.

8. The semiconductor integrated circuit device according to claim 1, wherein
   said producing means comprises an operational amplifier connected to receive an input voltage at an inverting input terminal and said plurality of field effect transistors produce said first current corresponding to the input voltage and further comprising a second field effect transistor having a gate connected to the gate voltage from said operational amplifier and a drain connected to a resistor and to a non-inverting input terminal of said operational amplifier.

9. The semiconductor integrated circuit device according to claim 8, wherein
   said second field effect transistor and the plurality of field effect transistors have sources connected to a power supply.

10. The semiconductor integrated circuit device according to claim 8, wherein
    said bias generating circuit, said group of current sources and said switching circuit are formed on said single semiconductor chip.

11. The semiconductor integrated circuit device according to claim 10, wherein
    said second field effect transistor and said plurality of field effect transistors are formed close to each other on said single semiconductor chip.

12. The semiconductor integrated circuit device according to claim 1, further comprising data conversion means responsive to digital data to produce a select signal, and load resistors connected to outputs of said group of current sources, wherein digital data are converted to an analog voltage.

13. A semiconductor integrated circuit device, formed in a semiconductor chip, comprising:
    a plurality of digital to analog converters, each including
       an output terminal outputting an analog signal,
       a plurality of current source transistors having gates connected to each other,
       a plurality of switching transistors responsive to a digital signal and connected between the current source transistors and the output terminal,
       a first transistor composing a first current mirror circuit with the current source transistors, and
       a second current mirror circuit having a first node, connected to the first transistor, and a second node; and
    a current bias generating circuit including a plurality of second transistors, each second transistor connected to the second node of a respective second current mirror circuit, each having a gate, and
    a bias voltage generating circuit commonly supplying a bias voltage to the gate of each second transistor and including a third transistor having a gate connected to the gate of each second transistor, wherein each second transistor is arranged adjacent to the third transistor.

* * * * *

UNITED STATES PATENT AND TRADEMARK OFFICE
CERTIFICATE OF CORRECTION

PATENT NO. : 5,155,385

DATED : October 13, 1992

INVENTOR(S) : GOTOH et al

It is certified that error appears in the above-identified patent and that said Letters Patent is hereby corrected as shown below:

On the title page Item [75]:

Please correct inventor Kunihiko Gotoh's residence from "Tama" to

--Tokyo--.

Signed and Sealed this

Twelfth Day of October, 1993

Attest:

BRUCE LEHMAN

Attesting Officer

Commissioner of Patents and Trademarks